United States Patent
Zitzlsperger et al.

(10) Patent No.: US 9,978,918 B2
(45) Date of Patent: May 22, 2018

(54) METHOD FOR PRODUCING AN OPTOELECTRONIC DEVICE

(71) Applicant: OSRAM Opto Semiconductors GmbH, Regensburg (DE)

(72) Inventors: Michael Zitzlsperger, Regensburg (DE); Tobias Gebuhr, Regensburg (DE); Thomas Schwarz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 10 days.

(21) Appl. No.: 14/902,834

(22) PCT Filed: Jul. 3, 2014

(86) PCT No.: PCT/EP2014/064217
§ 371 (c)(1),
(2) Date: Jan. 4, 2016

(87) PCT Pub. No.: WO2015/001036
PCT Pub. Date: Jan. 8, 2015

(65) Prior Publication Data
US 2016/0172559 A1    Jun. 16, 2016

(30) Foreign Application Priority Data
Jul. 4, 2013  (DE) ........................ 10 2013 213 073

(51) Int. Cl.
*H01L 33/62*  (2010.01)
*H01L 33/50*  (2010.01)
(Continued)

(52) U.S. Cl.
CPC .............. *H01L 33/62* (2013.01); *H01L 24/73* (2013.01); *H01L 33/505* (2013.01);
(Continued)

(58) Field of Classification Search
CPC ....................................................... H01L 33/62
See application file for complete search history.

(56) References Cited

U.S. PATENT DOCUMENTS

| 5,177,593 | A  | * | 1/1993 | Abe   | .......................... | G09F 9/33 |
|           |    |   |        |       |                           | 257/100   |
| 6,531,328 | B1 | * | 3/2003 | Chen  | ........................  | H01L 24/97 |
|           |    |   |        |       |                           | 438/106   |

(Continued)

FOREIGN PATENT DOCUMENTS

| DE | 102011078906 A1 | 1/2013 |
| DE | 102011115314 A1 | 4/2013 |

(Continued)

*Primary Examiner* — Eugene Lee
(74) *Attorney, Agent, or Firm* — Slater Matsil, LLP

(57) ABSTRACT

A method can be used for producing an optoelectronic device. A first leadframe section with a component is provided. The component is designed to emit electromagnetic radiation on an emission side. The emission side faces away from the carrier. A second leadframe section is provided. In a first method step the component and the two leadframe sections are encapsulated with a first potting material in such a way that the component and the leadframe sections are embedded into a potting body, but wherein at least part of the emission area of the component remains free of the first potting material and a cutout is formed in the potting body at least above the emission area of the component. In a second method step a second potting material is molded into the cutout of the potting body, such that the emission side of the component is covered with the second potting material.

16 Claims, 6 Drawing Sheets

(51) Int. Cl.
  *H01L 33/54* (2010.01)
  *H01L 23/00* (2006.01)
  *H01L 25/075* (2006.01)
  *H01L 33/48* (2010.01)

(52) U.S. Cl.
  CPC ............ *H01L 33/507* (2013.01); *H01L 33/54* (2013.01); *H01L 25/0753* (2013.01); *H01L 33/486* (2013.01); *H01L 2224/16245* (2013.01); *H01L 2224/48091* (2013.01); *H01L 2224/48471* (2013.01); *H01L 2224/48479* (2013.01); *H01L 2924/12041* (2013.01); *H01L 2924/1815* (2013.01); *H01L 2933/005* (2013.01); *H01L 2933/0033* (2013.01); *H01L 2933/0041* (2013.01); *H01L 2933/0066* (2013.01)

(56) References Cited

U.S. PATENT DOCUMENTS

| | | | | |
|---|---|---|---|---|
| 6,576,930 B2 * | 6/2003 | Reeh | | C09K 11/7718 257/100 |
| 6,624,491 B2 * | 9/2003 | Waitl | | H01L 31/0203 257/434 |
| 6,949,771 B2 * | 9/2005 | Yoganandan | | H01L 33/486 257/99 |
| 8,044,412 B2 * | 10/2011 | Murphy | | H01L 23/60 257/81 |
| 8,426,875 B2 | 4/2013 | Singer et al. | | |
| 8,435,808 B2 * | 5/2013 | Jung | | H01L 33/486 257/100 |
| 8,716,744 B2 * | 5/2014 | Chan | | H01L 33/486 257/100 |
| 9,190,394 B2 | 11/2015 | Singer et al. | | |
| 9,209,328 B2 | 12/2015 | Weidner et al. | | |
| 2003/0141510 A1 * | 7/2003 | Brunner | | H01L 33/486 257/81 |
| 2003/0211804 A1 * | 11/2003 | Sorg | | H01L 33/486 445/24 |
| 2008/0012036 A1 * | 1/2008 | Loh | | H01L 33/483 257/99 |
| 2008/0258168 A1 * | 10/2008 | Loh | | H01L 33/486 257/99 |
| 2009/0065792 A1 * | 3/2009 | Thompson | | H01L 33/54 257/98 |
| 2010/0181582 A1 * | 7/2010 | Li | | H01L 33/44 257/91 |
| 2010/0295078 A1 * | 11/2010 | Chen | | H01L 33/50 257/98 |
| 2011/0114979 A1 * | 5/2011 | Jang | | H01L 33/486 257/98 |
| 2011/0156085 A1 | 6/2011 | Lin et al. | | |
| 2011/0220926 A1 * | 9/2011 | Kim | | H01L 33/60 257/91 |
| 2012/0037944 A1 * | 2/2012 | Takine | | H01L 33/60 257/98 |
| 2012/0241789 A1 | 9/2012 | Chan et al. | | |
| 2012/0319150 A1 * | 12/2012 | Shimomura | | H01L 24/97 257/98 |
| 2013/0062632 A1 * | 3/2013 | Lee | | H01L 25/0753 257/88 |
| 2013/0121000 A1 * | 5/2013 | Lee | | H01L 33/56 362/293 |
| 2014/0061682 A1 * | 3/2014 | Kobayashi | | H01L 33/486 257/88 |
| 2014/0159101 A1 * | 6/2014 | Kippes | | H01L 33/54 257/99 |
| 2014/0197551 A1 * | 7/2014 | Porwol | | H01L 21/566 257/787 |

FOREIGN PATENT DOCUMENTS

| | | |
|---|---|---|
| EP | 2477242 A2 | 7/2012 |
| WO | 2009067989 A1 | 6/2009 |
| WO | 2011015449 A1 | 2/2011 |
| WO | 2013061228 A1 | 5/2013 |

* cited by examiner

METHOD FOR PRODUCING AN OPTOELECTRONIC DEVICE

This patent application is a national phase filing under section 371 of PCT/EP2014/064217, filed Jul. 3, 2014, which claims the priority of German patent application 10 2013 213 073.2, filed Jul. 4, 2013, each of which is incorporated herein by reference in its entirety.

TECHNICAL FIELD

The invention relates to a method for producing an optoelectronic device and to an optoelectronic device.

BACKGROUND

In the prior art it is known to produce an optoelectronic device in such a way that a first leadframe section and a second leadframe section are provided. A component is fixed on the first leadframe section. In addition, an electrical contact of the component is connected to the second leadframe section by means of a contact wire. Subsequently, the first and second leadframe sections are embedded into a potting material.

SUMMARY

Embodiments of the invention provide an improved method for producing an optoelectronic device and an improved device.

One advantage of the method described is that when the two leadframe sections are embedded into the potting material, at least part of the emission face of the component remains free of the potting material. In this way, a cutout is provided, into which a second potting material is molded in a later method step. In this way, the cutout and thus the emission face of the component are defined precisely. This is achieved, for example, by a transfer molding tool with a corresponding shape being placed onto the component, wherein the transfer molding tool covers the emission face.

In a further embodiment, the cutout of the potting body has a space that is required for later contacting of the contact wire with a contact pad of the component and with a second contact pad of the second leadframe section. In this way, the contact wire can first be connected to the contact pads of the component and of the second leadframe section even after the production of the potting body. An increased flexibility in the production of the optoelectronic device is achieved as a result.

In a further embodiment, the contact wire is already connected to the component and the second leadframe section during the introduction of the first potting material. In this case, the space in which the contact wire is situated and the cutout are filled with the second potting material. A simple method for producing a device is provided in this way. Consequently, the contact wire is also at least partly embedded into the second potting material. As a result, the contact wire is protected against environmental influences.

In a further embodiment, the second potting material comprises a conversion material, wherein the conversion material is designed to prevent a wavelength of an electromagnetic radiation. By way of example, phosphor can be used as conversion material.

In a further embodiment, the second potting material is embodied without conversion material. In this embodiment, either the conversion material can be completely dispensed with or a converter layer is provided, which is arranged on the emission side of the component. Consequently, in this embodiment a shift in the wavelength is not achieved by means of the second potting material, but rather by means of the converter layer. The converter layer can likewise comprise phosphor, for example.

Depending on the embodiment chosen, in the first method step the emission side of the component is covered at least partly with the aid of a transfer molding tool. The use of a transfer molding tool is cost-effective and can easily be used for forming the desired cutout. The use of film assisted transfer molding makes it possible to ensure that the chip surfaces are not damaged.

In a further embodiment, a plurality of components are provided, wherein the plurality of components are provided with the first potting material in accordance with the first method step, wherein the cutout is formed in such a way that the cutout extends over emission sides of a plurality of components, wherein the cutout is filled with the second potting material in accordance with the second method step. In this way, with the aid of one method step, a plurality of components with a potting body can simultaneously be provided with a cutout, wherein the cutout of the potting bodies is subsequently filled with the second potting material in a second method step. Cost-effective manufacture is achieved in this way.

In a further embodiment, the height of the potting body relative to the emission side of the component is adapted to a desired height with the aid of a removal method, in particular with the aid of an etching method. In this way, a cost-effective potting body can be produced which is subsequently reduced to a precise height by means of a removal method. A cost-effective method with a sufficiently precise setting of the height of the potting body is thus provided.

In a further embodiment, a sidewall of the cutout of the potting body is adapted to a desired shape with the aid of a removal method, in particular with the aid of an etching method, before the second method step. In this embodiment, too, a cost-effective method is provided with which a precise shape of the cutout is achieved.

Moreover, depending on the desired embodiment, both a volume conversion of the wavelength and a layer conversion of the wavelength can be integrated in one device.

With the aid of the methods described, it is possible to provide a volume conversion at low costs. Moreover, with the aid of the method described, an optoelectronic device can be provided which has a precise delimitation of the emission face and, moreover, shifts the electromagnetic radiation of the component at least partly in terms of the wavelength with the aid of a volume conversion. The volume conversion is achieved with the aid of the conversion element which is produced in the cutout by the second potting material being introduced by filling. Moreover, the shape of the emitting face of the component can be chosen freely with the aid of the method described. In particular, the emitting face can be rectangular, round or have some other shape.

Moreover, the depth of the cutout over the emission face can be chosen freely with the aid of the method described. Mechanically stabler devices can be achieved in this way. Furthermore, with the aid of the method described, a cutout for a volume converter can be produced simultaneously for a plurality of components. A cost-effective method for producing the optoelectronic devices is provided in this way.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, wherein.

DETAILED DESCRIPTION OF ILLUSTRATIVE EMBODIMENTS

Figure 1:
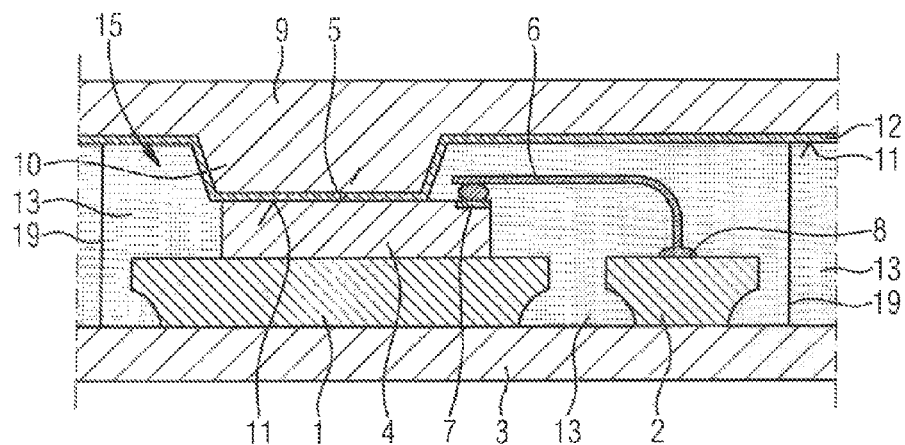
FIG. 1 shows a schematic cross section through a device with transfer molding tool.

FIG. 1 shows in a schematic illustration a cross section through an optoelectronic device after a first method step has been performed. A first and a second leadframe section 1, 2 are provided, which bear on a baseplate 3. The baseplate 3 is part of the transfer molding tool (in this case film assisted transfer molding). The first and second leadframe sections 1, 2 are produced from an electrically conductive material, for example, from a metal. An optoelectronic component 4 is arranged on the first leadframe section 1. The optoelectronic component 4 is embodied, for example, as a laser diode or as a light-emitting diode. The component 4 has an emission side 5 arranged in a manner facing away from the first leadframe section 1. Moreover, a contact wire 6 is provided, which is connected by one end to a first contact pad 7 of the component 4 and by a second end to a second contact pad 8 of the second leadframe section 2. The first contact pad 7 is formed at the component 4 on the side of the emission face. Furthermore, an embossing plate 9 of the transfer molding tool is provided. The embossing plate 9 is embodied in the form of a planar plate and has a projecting stamp 10 in the region of the emission side 5. The stamp 10 has a planar bearing face 11 but bears on the emission side 5 of the component 4. In this way, at least part of the emission side 5 is covered or delimited relative to the surrounding space between the baseplate 3 and the embossing plate 9. Depending on the embodiment chosen, the stamp 10 can also be embodied in the form of a sleeve that bears only by an edge region on the emission side 5 and in this way delimits at least part of the emission side 5 in relation to the surrounding space. Depending on the embodiment chosen, the entire embossing side 11 of the embossing plate 9 can be covered with a film 12.

Moreover, a first potting material 13 is introduced into the interspace between the embossing plate 9 and the baseplate 3. The first potting material 13 can comprise, for example, silicone, epoxy resin or a hybrid material comprising silicone and epoxy resin. The first potting material 13 can be embodied such that it is substantially non-transparent to electromagnetic radiation of the optoelectronic component 4. Moreover, FIG. 1 schematically illustrates separating edges 19, along which the device is separated from an arrangement of a multiplicity of devices. In general, a multiplicity of devices are produced simultaneously, rather than an individual device.

Figure 2:
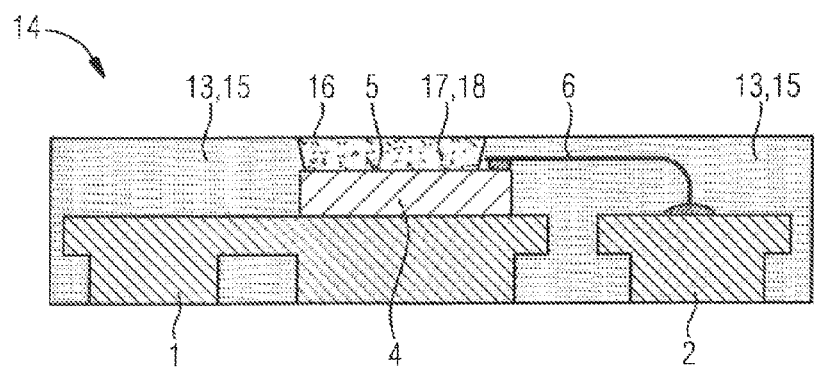
FIG. 2 shows the device from FIG. 1 after completion.

After the potting material 13 has been cured to form a potting body 15, the baseplate 3 and the embossing plate 9 are removed and an optoelectronic device is obtained which is illustrated in cross section in FIG. 2. The optoelectronic device 14 comprises a potting body 15 composed of the first potting material 13, into which the first and second leadframe sections 1, 2, the component 4 and the contact wire 6 are embedded. Moreover, a cutout 16 is formed in the potting body 15 above the emission side 5 of the component 4.

In a further method step, the cutout 16 is filled at least partly with a second potting material 17 and a second potting body 18 is thus obtained. The second potting material 17 is illustrated schematically in FIG. 2 with the aid of dots in the cutout 16. The second potting material 17 can comprise, for example, silicone or an epoxy resin or a hybrid material comprising silicone and epoxy resin. The second potting material 17 can be embodied such that it is substantially transparent to electromagnetic radiation, in particular to the electromagnetic radiation of the component 4. Moreover, the second potting material 17 can comprise scattering particles, such as titanium oxide, for example. Furthermore, the second potting material can also comprise a conversion material that carries out a shift in the wavelength of an electromagnetic radiation of the component 4. The conversion material can be embodied for example in the form of a luminophore. By way of example, the luminophore can comprise phosphor. The optoelectronic component 4 has a further electrical contact on the underside, for example, via which further electrical contact the component 4 is supplied with a further voltage potential.

The method illustrated schematically in FIGS. 1 and 2 concerns a molding process in which at least part of the emission side of the optoelectronic component 4 is kept free of the first potting compound 13 in a first method step, and it is only in a second method step that the emission side is provided with a second potting material. The second potting material can cure, for example, in the form of a scattering and/or wavelength-converting second potting body 18.

Figure 3:
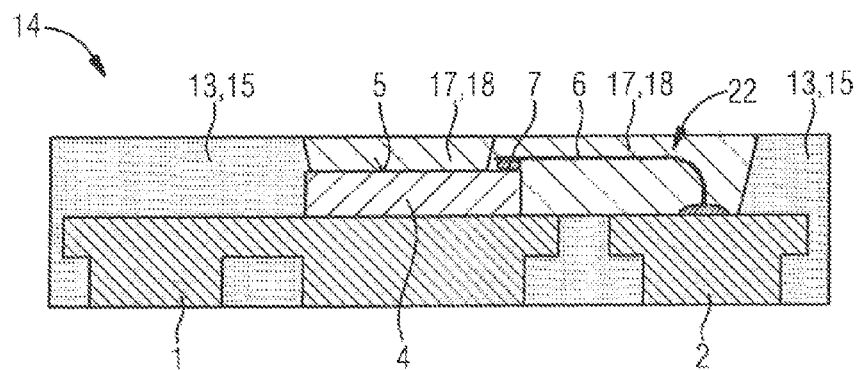
FIG. 3 shows a further embodiment of a device after the first method step in a sectional illustration.
Figure 4:
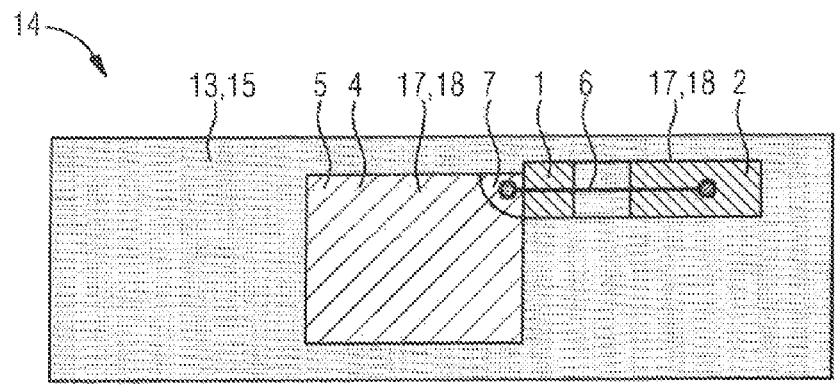
FIG. 4 shows the device from FIG. 3 with a view from above.

FIG. 3 shows a further embodiment of a device 14, which is embodied substantially in accordance with the embodiment in FIG. 2, but the cutout 16 additionally encompasses a space 22, in which the contact wire 6 is arranged. Consequently, both at least part of the emission side 5 of the component 4 and the contact wire 6 are not embedded into the potting body 15. The cutout 16 and the space 22 are filled at least partly with the second potting material 17, such that the contact wire 6 is embedded into the second potting body 18. FIG. 4 shows the device 14 from FIG. 3 from above.

Figure 5:
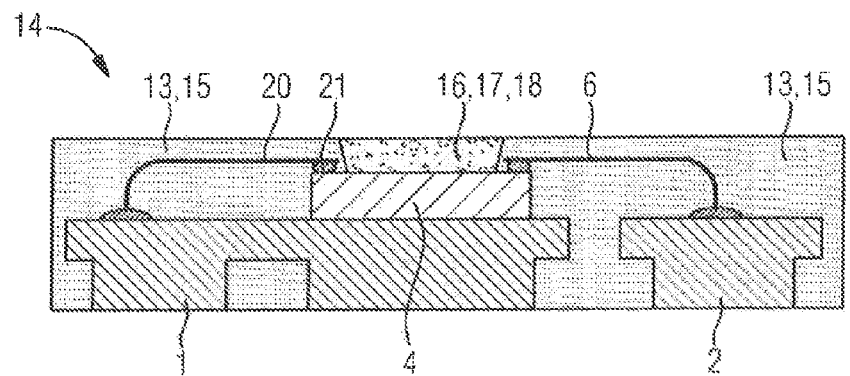
FIG. 5 shows a further embodiment of a device.

FIG. 5 shows an embodiment in which the component 4 is supplied with a further voltage potential with the aid of a second contact wire 20 in addition to the contact wire 6. The second contact wire 20 is connected to a further contact pad 21 arranged on the emission side 5 of the component 4. The other end of the second contact wire 20 is connected to the first leadframe section 1. In this embodiment, the component 4 can be embodied on a volume emitting sapphire chip, for example. The second contact wire 20 is embedded into the potting body 15 like the contact wire 6.

Figure 6:
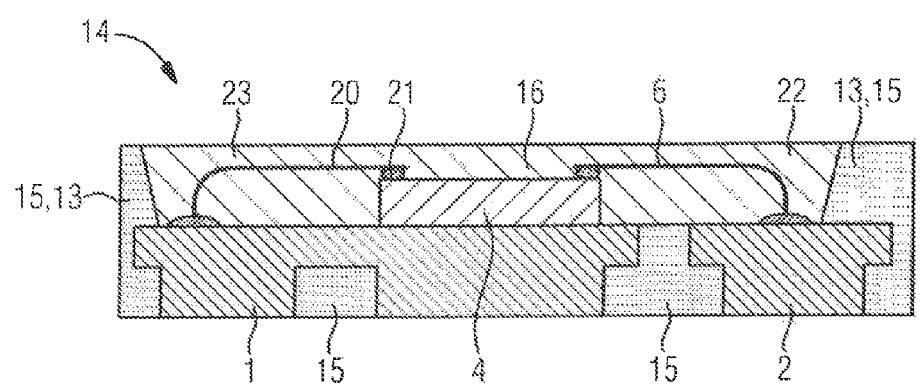
FIG. 6 shows a further embodiment of a device.

FIG. 6 shows a further embodiment of a device 14, which is embodied substantially in accordance with the embodiment in FIG. 6, but the cutout 16 encompasses two spaces 22, 23. The spaces 22, 23 encompass the contact wire 6 and the second contact wire 20. Consequently, the contact wires 6, 20 are not embedded into the potting body 15, but rather into the second potting body 18 formed by the second potting material 17. The leadframe sections 1, 2 and the component 4 are embedded into the potting body 15 that was produced in accordance with the first method step described above. Moreover, a cutout 16 is formed above the emission side 5 of the component 4, in which cutout a second potting material 17 is introduced by filling in accordance with the second method step. The second potting material 17 forms a second potting body 18.

Figure 7:
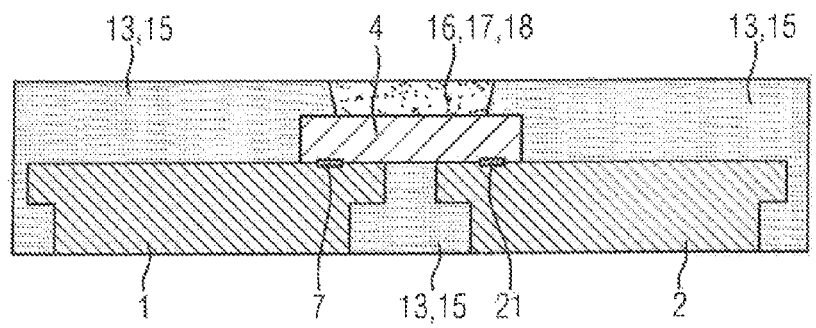
FIG. 7 shows a further embodiment of a device.

FIG. 7 shows a further embodiment of a device 14, in which the component 4 has two contact pads 7, 21 on an underside (sapphire flip chip). The first contact pad 7 bears on the first leadframe section 1. The further contact pad 21 bears on the second leadframe section 2. Consequently, no contact wires are required for the electrical contacting of the component 4.

FIGS. 8 to 13 show method steps of a method for producing an optoelectronic device 14.

Figure 8:
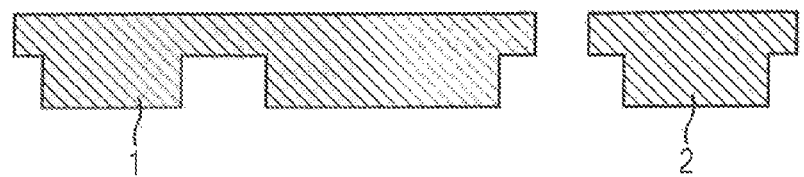
FIGS. 8 to 13 show method steps of a process sequence for producing a device.
Figure 9:
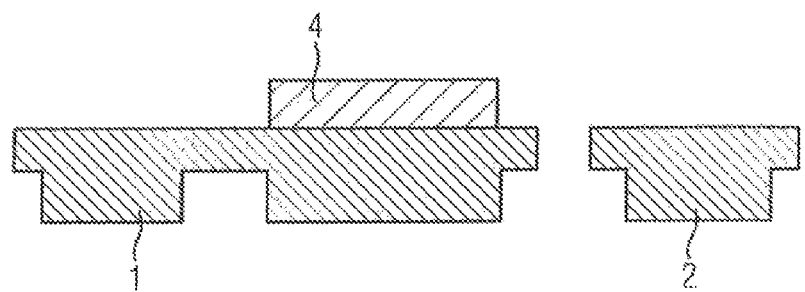

FIG. 8 shows the first and second leadframe sections 1, 2 in cross section. The first and second leadframe sections 1, 2 are formed from a leadframe structure with the aid of an etching method, for example. Afterward, a component 4 is fixed on the first leadframe section 1. This can be achieved with the aid of a bonding method, for example. This method state is illustrated in FIG. 9.

Figure 10:
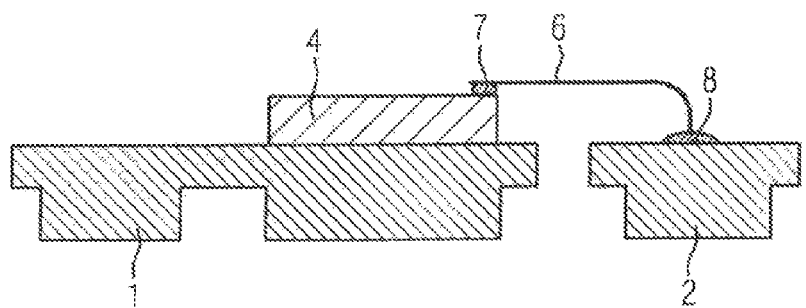

In a subsequent method step, illustrated in FIG. 10, a contact wire 6 is contacted with a first contact pad 7 formed on the emission side 5 of the component 4. Moreover, a second end of the contact wire 6 is electrically conductively connected to the second leadframe section 2.

Figure 11:
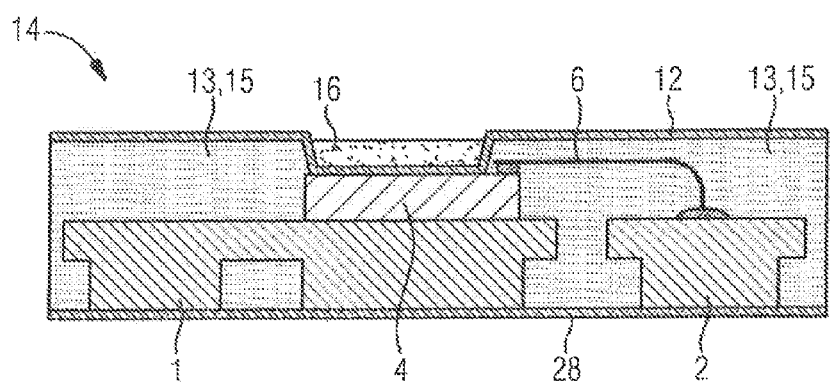

In a subsequent method section, illustrated in FIG. 11, the first and second leadframe sections 1, 2, the component 4 and the contact wire 6 are embedded into a first potting material 13, which cures to form a first potting body 15, as already explained with reference to FIG. 1. In this case, before the first potting material 13 is introduced, for example, a film 12 is provided between the embossing plate 9 and the component 4 and a further film 28 is provided between the baseplate 3 and the leadframe sections 1, 2. The films 12, 28 have the advantage that the embossing plate 9 and the baseplate 3 can be released more easily from the potting body 15. The films can, for example, be formed from ETFE (ethylene tetrafluoroethylene) and have a thickness of 50 to 250 μm, for example.

Figure 12:
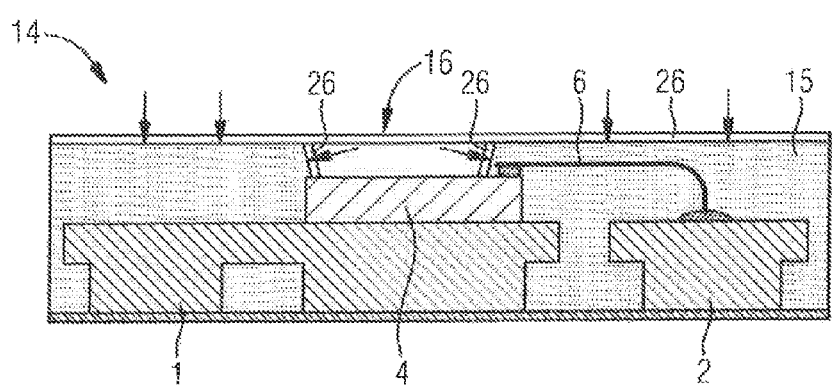

In a subsequent method step, the films 12, 28 are removed. Afterward, by way of example, a top side 24 of the potting body 15 is removed with the aid of a chemical etching method, as is illustrated in FIG. 12. A precise setting of the height of the potting body 15 can be achieved in this way. Moreover, at least one sidewall or all sidewalls of the cutout 16 is/are also removed depending on the embodiment chosen. By way of example, a chemical etching method can likewise be used for the removal. The exact shape of the cutout can be defined in this way. This is advantageous in particular in order to define a precise delimitation of the emission face of the component 4. The removal methods are illustrated schematically in the form of arrows in FIG. 12. Moreover, contour lines 26 are provided, representing the boundary faces of the potting body 15 before the removal method.

Figure 13:
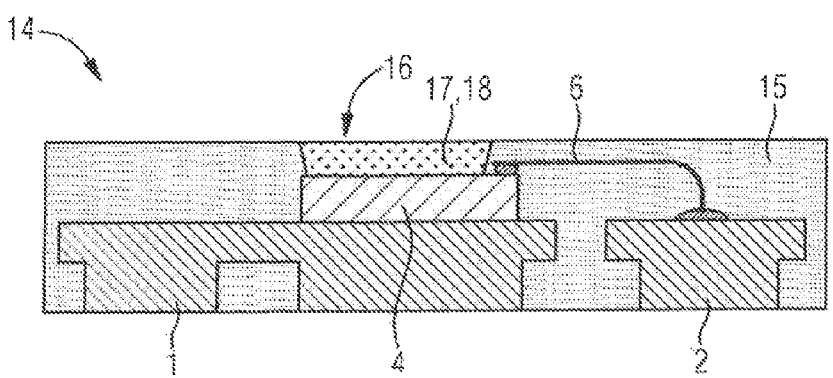

In a subsequent method step, illustrated in FIG. 13, the second potting material 17 is introduced into the cutout 16 and a second potting body 18 is thus formed above the emission side 5 of the component 4. As already explained above, the second potting material 17 can comprise a conversion material and/or scattering bodies.

Figure 14:
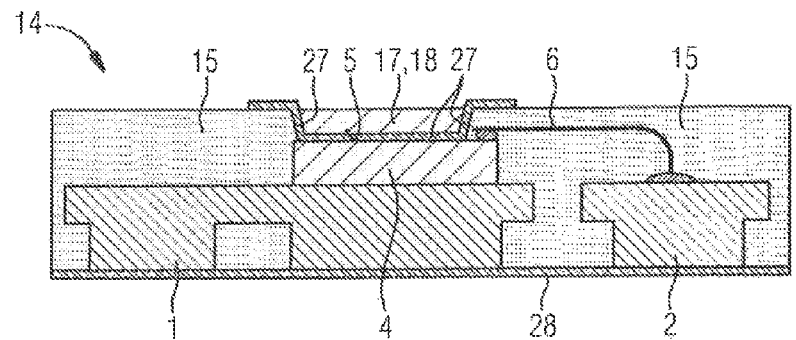
FIG. 14 shows a cross section through a further embodiment of a device.

FIG. 14 shows a further embodiment of a device 14, in which a conversion layer 27 is introduced into the cutout 16 after carrying out the first process step with the production of the potting body 15 and the cutout 16. The conversion layer 27 can be applied to the free area of the emission side 5 of the component 4 and the sidewalls of the cutout 16, for example, with the aid of a spraying method. Afterward, depending on the embodiment chosen, the remaining part of the cutout 16 can be filled with a second potting material 17 and a second potting body 18 can be formed. The second potting material 17 can comprise scattering bodies and/or conversion material. Moreover, the second potting body 18 can also be formed without scattering bodies and without conversion material. Furthermore, the second potting body 18 can also be dispensed with.

Figure 15:
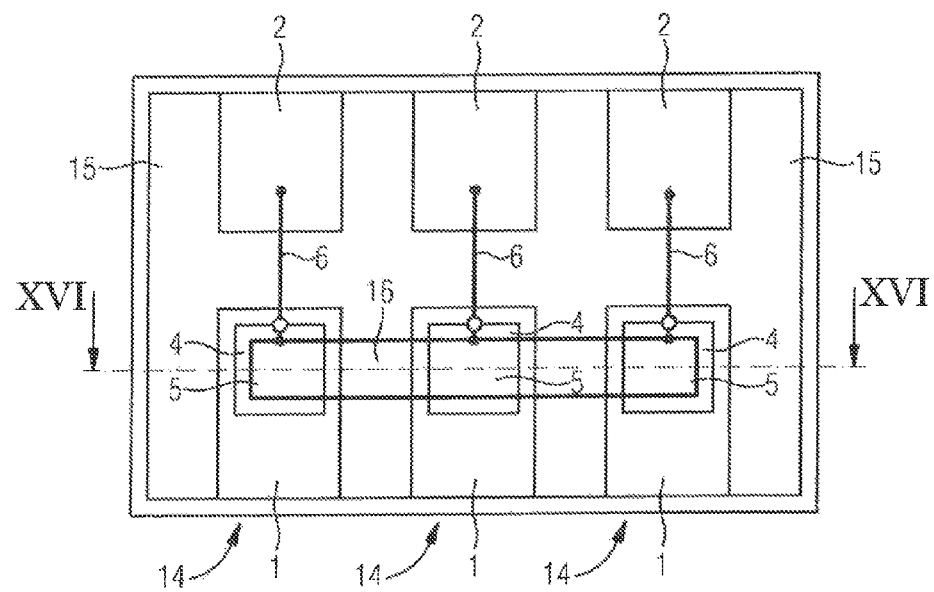
FIG. 15 shows a further embodiment comprising a plurality of devices.

FIG. 15 shows an arrangement comprising a plurality of devices 14 in a schematic plan view. Each device 14 is embodied in accordance with the device 14 in FIG. 2, but the cutout 16 and the potting body 15 extend over the emission sides 5 of at least two devices 14. In the exemplary embodiment illustrated, the cutout 16 extends over the emission sides 5 of three components 4. Consequently, FIG. 15 shows the arrangement comprising the components 4 after the first process step. In a subsequent process step, the cutout 16 is filled at least partly with a second potting material 17.

Figure 16:
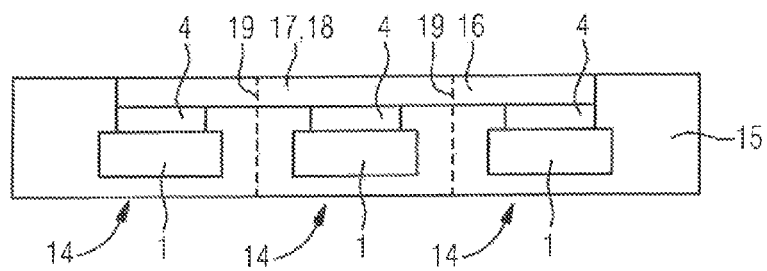
FIG. 16 shows a cross section through the arrangement in FIG. 15 in the region of the cutout.

FIG. 16 shows a cross section through the arrangement from FIG. 15, wherein the extension of the second potting body 18 over at least the emission sides 5 of three components 4 is clearly discernible. Moreover, FIG. 16 depicts separating edges 19 via which the arrangement can be separated into individual devices.

Depending on the embodiment used, in the embodiment in FIG. 15 as a result of the formation of a second potting body 18 for a plurality of components 4 it is possible to reduce a decrease in the luminance between the individual components 4. For this purpose, scattering bodies can preferably also be arranged in the second potting body 18.

Although the invention has been more specifically illustrated and described in detail by means of the preferred exemplary embodiment, nevertheless the invention is not restricted by the examples disclosed and other variations can be derived therefrom by the person skilled in the art, without departing from the scope of protection of the invention.

The invention claimed is:

1. A method for producing an optoelectronic device, wherein the optoelectronic device comprises a first leadframe section with a component and a second leadframe section, and wherein the component is designed to emit electromagnetic radiation from an emission side that faces away from the first leadframe section, the method comprising:

encapsulating the component and the first and second leadframe sections in a first potting material in such a way that the component and the first and second leadframe sections are embedded in a potting body;

forming a cutout in the potting body at least above the emission side of the component so that an emission surface of the component is not covered by the first potting material; and molding a second potting material into the cutout of the potting body such that the emission surface of the component is covered with the second potting material, wherein encapsulating the component and the first and second leadframe sections in the first potting material comprises:

placing the component between a baseplate and an embossing plate of a transfer molding tool such that the embossing plate covers the emission side of the component thereby preventing coverage of the emission surface with the first potting material;

introducing the first potting material into the transfer molding tool;

forming the potting body, wherein the potting body comprises a cutout at a location where the embossing plate covers the emission side of the component; and removing the transfer molding tool from the potting body thereby obtaining the potting body with the cutout.

2. The method as claimed in claim 1, wherein the component has an electrical contact pad for a contact wire on the emission side, wherein the first potting material is distributed such that the cutout encompasses a space that encompasses the electrical contact pad and a second contact pad of a surface of the second leadframe section, wherein the method further comprises electrically connecting the contact wire to the electrical contact pad and the second contact pad of the second leadframe section that has remained free of the first potting material, and wherein molding the second potting material comprises covering the electrical contact pad, the second contact pad and the contact wire with the second potting material.

3. The method as claimed in claim 1, wherein a contact wire is electrically conductively connected to an electrical contact pad of the first leadframe section and to a second contact pad of the second leadframe section, wherein encapsulating the component and the first and second leadframe sections comprises distributing the first potting material such that the cutout encompasses a space that encompasses the electrical contact pads and the contact wire, and wherein molding the second potting material comprises at least partially covering the contact wire and the electrical contact pads with the second potting material.

4. The method as claimed in claim 1, wherein the second potting material comprises conversion material that is designed to alter a wavelength of electromagnetic radiation emitted from the emission side of the component.

5. The method as claimed in claim 1, wherein the second potting material is embodied without conversion material.

6. The method as claimed in claim 1, wherein the component has a converter layer on the emission side, the converter layer being designed to alter a wavelength of electromagnetic radiation emitted from the emission side of the component, and wherein molding the second potting material comprises applying the second potting material to the converter layer.

7. The method as claimed in claim 1, wherein encapsulating the component and the first and second leadframe sections in the first potting material comprises encapsulating a plurality of components, wherein the cutout is formed in such a way that the cutout extends over emission sides of a plurality of components.

8. The method as claimed in claim 1, further comprising removing material so that a height of the potting body relative to the emission side is adapted to a desired height.

9. The method as claimed in claim 8, wherein removing the material comprises etching.

10. The method as claimed in claim 1, further comprising performing an etch so that a sidewall of the cutout of the potting body is adapted to a desired shape, the etch performed before molding the second potting material into the cutout of the potting body.

11. An optoelectronic device produced using the method according to claim 1.

12. The method according to claim 1, wherein encapsulating the component and the first and second leadframe sections in the potting material comprises placing a film directly on the emission side of the component and placing the embossing plate directly on the film.

13. The method according to claim 12, wherein the film is a plastic film.

14. A method for producing a plurality of optoelectronic devices from a plurality of components and a leadframe with a plurality of first leadframe sections and a plurality of second leadframe sections, wherein a component is provided on each first leadframe section, and wherein each component is designed to emit electromagnetic radiation from an emission side that faces away from the first leadframe section, the method comprising:

encapsulating the components and the first and second leadframe sections in a potting material, wherein encapsulating the components comprises:

placing the components between a baseplate and an embossing plate of a transfer molding tool such that the embossing plate covers the emission sides of the a plurality of components thereby preventing coverage of the emission sides with the potting material;

introducing the potting material into the transfer molding tool;

forming a potting body, wherein the potting body comprises a cutout at a location where the embossing plate covers the emission sides of the components; and removing the transfer molding tool from the potting body, thereby obtaining the potting body with the cutout, wherein the cutout is formed in such a way that the cutout extends over the emission sides of the plurality of components.

15. The method according to claim 14, further comprising separating the encapsulated components and the leadframe into a plurality of optoelectronic devices.

16. An optoelectronic device produced using the method according to claim 14.

* * * * *